United States Patent [19]
Shishido et al.

[11] Patent Number: 5,763,123
[45] Date of Patent: Jun. 9, 1998

[54] METHOD FOR PRODUCING THIN-FILM SUBSTRATE

[75] Inventors: Chie Shishido; Yukio Matsuyama; Hiroya Hoshishiba; Haruhisa Sakamoto, all of Yokohama, Japan

[73] Assignee: Hitachi, Ltd., Tokyo, Japan

[21] Appl. No.: 781,748

[22] Filed: Jan. 10, 1997

Related U.S. Application Data

[63] Continuation of Ser. No. 362,721, Dec. 23, 1994, abandoned.

[30] Foreign Application Priority Data

Dec. 28, 1993 [JP] Japan ..................... 5-334295

[51] Int. Cl.$^6$ ................... G01N 21/88; G01N 21/66; G03G 5/58
[52] U.S. Cl. .................. 430/30; 430/311; 430/313; 430/318; 356/237; 356/394; 250/559.44
[58] Field of Search .............. 430/30, 311, 313, 430/318; 250/559.44, 559.09; 356/237, 394

[56] References Cited

U.S. PATENT DOCUMENTS

| | | | |
|---|---|---|---|
| 4,421,410 | 12/1983 | Karasaki | 356/378 |
| 4,692,690 | 9/1987 | Hara et al. | 356/394 |
| 4,810,095 | 3/1989 | Kawauchi et al. | 356/394 |
| 5,278,012 | 1/1994 | Yamanaka et al. | 430/30 |

*Primary Examiner*—Thorl Chea
*Attorney, Agent, or Firm*—Kenyon & Kenyon

[57] ABSTRACT

The present invention relates to a method for producing a thin film substrate for forming a thin film circuit pattern on a substrate by repeating the lithography process using a photoresist and provides a method for producing a thin film having a high yield by preventing accumulation of faults at the time of thin film forming with high reliability and executing the inspection and repair process efficiently using the characteristics of the condition of generated faults. The method is constructed so as to inspect a resist pattern without exposure to light before etching the base layer in the inspection process of the lithography process using a photoresist, to particularly repair a lacking-fault part among detected fault parts, to execute inspection for an etching remnant in the thin metal film inspection and repair process after the etching ends, and to remove and repair etching remnants, if any.

6 Claims, 14 Drawing Sheets

METHOD FOR PRODUCING THIN-FILM SUBSTRATE

This is a continuation of application Ser. No. 08/362,721 filed 23 Dec. 1994, now abandoned.

BACKGROUND OF THE INVENTION

The conventional lithography process in the multilayer thin-film substrate producing process such as LSI will be explained according to Chapter 8 of "Latest LSI Process Technology" published by Industry Investigation Institute in 1983 with reference to FIG. 1.

FIG. 1 is a schematic view of the flow of the lithography process relating to the prior art. In FIG. 1, numeral 1 indicates a wafer and 2 indicates a chip area and the lithography process is shown by a cross sectional view. First, a wafer with a film to be processed (hereinafter referred to as a backing film) is pretreated (washing) (Step A). A photoresist 12 is coated on the wafer (Step B) and then pre-baking (may be referred to as soft baking) is executed at a comparatively low temperature such as about 80° C. so as to volatilize an organic solvent from the coated photoresist (Step C).

Next, light is irradiated onto it via a suitable mask so as to execute an exposure for baking the mask pattern (Step D). After exposure, at the developing step, the unnecessary part of the coated photoresist is dissolved by using the difference in the solubility of a suitable solvent (developing solution) between the exposure part and the nonexposure part so as to execute the developing step E and the pattern is formed on the resist.

There are two kinds of photoresists available, such as the negative kind that the exposure part is not soluble in the developing solution and the positive kind that the exposure part is soluble in the developing solution. At present, as finer patterns are required, the positive kind which can improve the resolution is used increasingly. However, in FIG. 1, both the positive kind and negative kind are shown respectively. As a developing solution, it is selected according to the photoresist. For the negative kind, solvents such as xylene are often used and for the positive kind, an alkali aqueous solution is often used. When the developing step E is finished, an observation using a metallurgical microscope or a fluorescent microscope is made by hand (Step F). Generally, 5 to 10 parts on a wafer are observed. As a result of observation at the step F, it is judged to send the wafer to the next step, to return it to the developing step, or to retry the whole resist process (NG). At some step, it is possible to sample and observe several wafers from a lot consisting of 25 wafers without observing the wafers one by one and judge in lot units whether they are sent to the next step or returned to the previous step.

Thereafter, heat treatment at a high temperature from 150° to 200° C., that is, posture (may be referred to as hard baking) is executed so as to volatilize organic components which are not evaporated from the resist pattern or to harden the unhardened part (Step G). By doing this, the adhesion with the base layer is improved and the etching resistance is increased.

Next, base layer etching is executed using the resist pattern as a mask (Step H). Only the part having no resist pattern is etched and the part having the etching pattern remains. When the resist is removed finally (Step I), the same pattern as the mask pattern is formed on the wafer and the lithography process ends and the good chip selection step (J) is executed as shown below.

Namely, when the lithography process is repeated several times on the wafer and the thin film forming ends, the predetermined processing such as processing on the back thereof is executed and then the wafer is cut into chips. Each chip is sorted into a nondefective part or defective part by various tests (good chip selection step J) and defective parts are scrapped.

The aforementioned prior art is a general art regarding the lithography process for the thin film pattern producing method using a photoresist.

However, when the whole substrate is a constitution unit like a thin film circuit pattern on a ceramic base substrate used in a computer or others, application of the aforementioned prior art comes into a problem.

The reason is as shown below. In the aforementioned prior art, when a wafer is separated into chips, defective chips are scrapped. However, when the whole substrate is a constitution unit like a thin film circuit pattern on a ceramic base substrate used in a computer or others, it is impossible to scrap a part of the substrate. Therefore, when there is a defective part on a entire substrate, the substrate itself is forced to be scrapped. Since the substrate area is large, there is a high possibility that a defective part occurs somewhere on the substrate. Therefore, it is difficult to increase the yield and an increase in the production cost results. Particularly when a circuit substrate consists of many layers, the steps which are executed so far are all brought to nothing and wasted. In the aforementioned general prior art, faults as mentioned above are left as they are until the thin film forming process ends and as a result, a substrate having faults is forced to be scrapped as a defective part.

From this point of view, to improve the yield of substrates, it is important to find a fault in each substrate and repair it so as to prevent it from being accumulated.

The next problem is related to the condition of faults in the thin film producing process.

Next, for understanding it, the condition under which a fault is generated in the thin film producing process will be explained.

As shown in FIG. 1, the lithography process is divided into the process for patterning a resist by exposure and developing and the process for patterning the backing film to be processed under the resist by etching.

Faults which are generated in the process for exposing and developing a resist are a fault that there is no resist pattern in a location where a resist pattern is to be formed originally such as a pin hole of the resist pattern (hereinafter referred to as a "lacking-fault") and a fault that there is a resist pattern in a location where no resist pattern is to be formed originally such as an undeveloped resist residue (hereinafter referred to as a "residue-fault"). When there is a lacking-fault in a resist, the part which is not to be etched is also etched, so that a fault that the part of the backing film which is not to be etched originally is also etched (hereinafter, this is also called a "lacking-fault") is generated. When there is a residue-fault in a resist, a fault that the part of the backing film which is to be etched originally is not etched (hereinafter, this is also called a "residue-fault") is generated.

Faults which are generated in the process for patterning the backing film by etching are the aforementioned lacking-fault and residue-fault of the backing film due to a fault of the resist pattern and a residue-fault of the backing film which is referred to as an "etching remnant" which is caused by foreign substances or insufficient circulation of an etching solution. Next, the characteristics of the two kinds of faults will be explained.

Generally for a base layer lacking-fault caused by a resist pattern fault, a base layer is to be added to the part where there is no base layer, so that the time required for repair is long. The added base layer remains as a part of the substrate, so that high reliability is required.

On the other hand, when the easiness to detect a fault is compared, it is extremely difficult to detect a residue-fault when the film of the part of residue-fault is thin because a resist is generally transparent. There is a possibility that there is a very thin resist residue, so that it is difficult to detect all the faults by an inspection apparatus. On the other hand, as to a resist lacking-fault, although a part which is not faulty may be pointed out as a fault by the inspection apparatus by mistake, the possibility of missing is very low.

The easiness of detection and repair varies with the fault generation condition as mentioned above, so that unless the two are distinguished from each other, the process for repairing a lacking-fault may be an obstacle to repairing of the base layer or labor to detect a residue-fault of the resist pattern may be spent.

The aforementioned art indicated in Japanese Laid-Open No. 2-94594 is an art for repairing a wiring pattern in which a fault occurs so as to prevent faults from being accumulated. However, only one step is assumed for the inspection and repair process and when a fault is missed by the inspection at this one step, it is necessary to scrap the faulty substrate itself and improvement of the yield is questionable. Furthermore, this art does not take the inspection and repair according to the characteristics of a lacking-fault and a residue-fault into account and execution of efficient inspection and repair using the characteristics of the two kinds of faults is questionable.

SUMMARY OF THE INVENTION

The present invention relates to a method for producing a thin film and a method for producing a multi-layer thin film substrate and more particularly to a method for producing a thin film which is most suited to improve the yield for producing multi-layer thin film substrates in the lithography process using a photoresist for forming a thin film circuit pattern on a ceramic base substrate.

According to the present invention, a method for producing a thin film having a high yield can be provided by preventing accumulation of faults at the time of thin film forming with higher reliability than that of the prior art and executing inspection and repair efficiently in the inspection and repair process using the characteristics of the condition of generated faults.

DETAILED DESCRIPTION

The present invention is designed to eliminate the difficulties of the prior art mentioned above and the object thereof is to provide a method for producing a thin film having a high yield by preventing accumulation of faults at the time of thin film forming with higher reliability than that of the prior art and executing inspection and repair efficiently in the inspection and repair process using the characteristics of the condition of generated faults.

Figure 2:
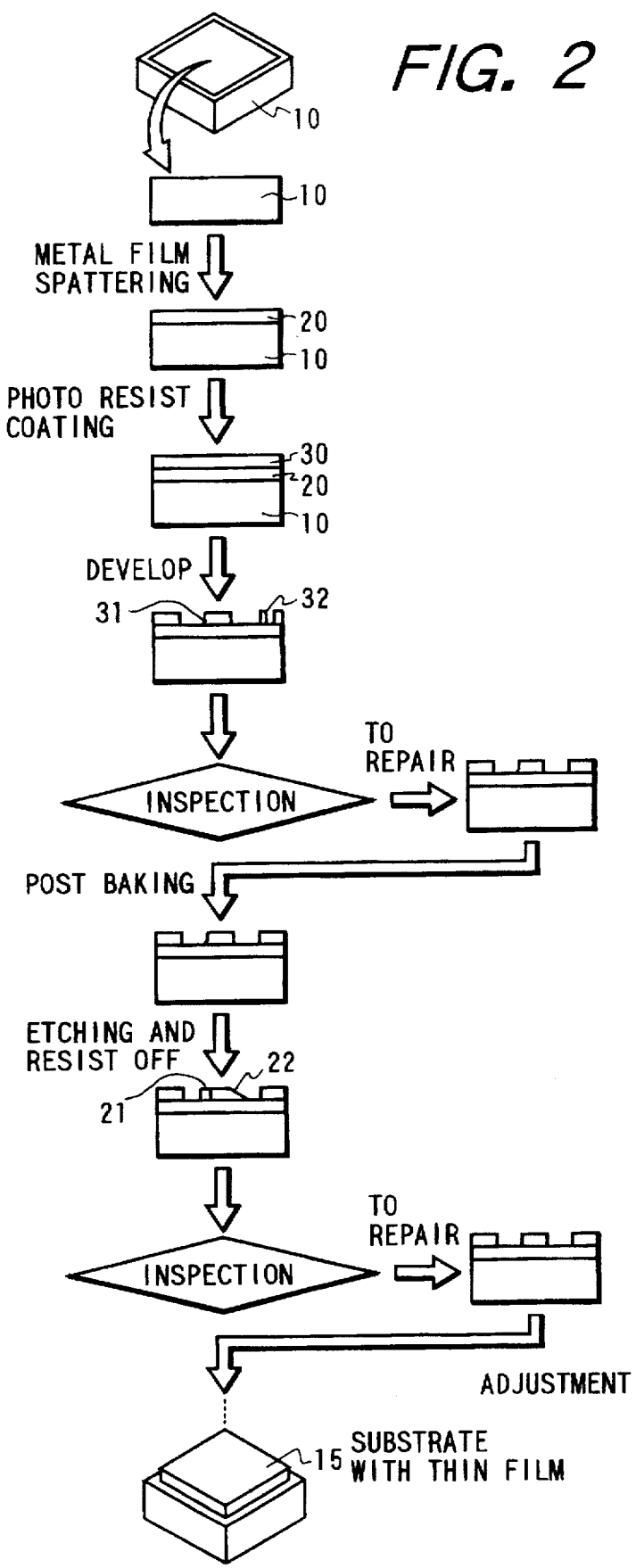
FIG. 2 is a schematic diagram showing the flow of the lithography process relating to an embodiment of the present invention.

To accomplish the above object, the invention constitution relating to the thin film producing method of the present invention, as shown in FIG. 2, consists of the following steps in the thin film producing method for forming a thin film circuit pattern on a substrate by repeating the lithography process using a photoresist:

(a1) step for coating a photoresist on a metal film which will be formed as circuit lines;

(a2) step for exposing and developing the photoresist so as to form a resist pattern;

(a3) step for inspecting the resist pattern which is formed at the step (a2) by using a first inspection apparatus having a lighting means and a detector for optically detecting the image of the resist pattern and a recognition means for recognizing a faulty part using the image of the resist pattern which is detected by the lighting means and detector and pointing out the fault location of the resist pattern;

(a4) step for repairing the faulty part on the basis of the information of fault location of the resist pattern which is pointed out at the step (a3);

(a5) step for masking the resist pattern which is repaired at the step (a4) and etching the metal film so as to form a thin metal film pattern;

(a6) step for inspecting the thin metal film pattern which is formed at the step (a5) by using a second inspection apparatus having a lighting means and a detector for optically detecting the image of the thin metal film pattern and a recognition means for recognizing the pattern image which is detected by the lighting means and detector and pointing out the fault location of the thin metal film pattern; and (a7) step for repairing the faulty part on the basis of the information of fault location of the thin metal film pattern which is pointed out at the step (a6), and the steps (a1) to (a7) are executed in this order.

In FIG. 2, numeral 10 indicates a ceramic base substrate and 20 indicates a metal film which will be formed as circuit lines. Numeral 30 indicates a photoresist, 31 a resist residue-fault, 32 a resist lacking-fault, 21 a metal film residue-fault caused by the resist residue-fault, and 22 a metal film residue-fault which is called an etching remnant. By the two inspections at the steps (a3) and (a6) and the repair of faults detected at the time of inspection at the steps (a4) and (a7), a fault-free thin film substrate can be obtained.

To accomplish the above object, another embodiment of the thin film producing method of the present invention will be explained with reference to FIG. 2. This constitution is also a thin film producing method for forming a thin film circuit pattern on a substrate by repeating the lithography process using a photoresist. It will be explained sequentially hereunder. The embodiment consists of the following steps:

(b1) step for coating a photoresist on a metal film which will be formed as circuit lines;

(b2) step for exposing and developing the photoresist so as to form a resist pattern;

(b3) step for inspecting the resist pattern which is formed at the step (b2) by using a first inspection apparatus having a lighting means and a detector for optically detecting the image of the resist pattern and a recognition means for recognizing a faulty part using the image of the resist pattern which is detected by the lighting means and detector and pointing out at least the location of a resist pattern lacking-fault among a resist pattern residue-fault and resist pattern lacking-fault which exist in the resist pattern;

(b4) step for repairing the faulty part on the basis of the information of location of the fault of the resist pattern which is pointed out at the step (b3);

(b5) step for masking the resist pattern which is repaired at the step (b4) and etching the metal film so as to form a thin metal film pattern;

(b6) step for inspecting the thin metal film pattern which is formed at the step (b5) by using a second inspection apparatus having a lighting means and a detector for optically detecting the image of the thin metal film pattern and a recognition means for recognizing the pattern image which is detected by the lighting means and detector and pointing out the residue-fault of the thin metal film pattern; and (b7) step for repairing the faulty part on the basis of the information of location of the fault of the thin metal film pattern which is pointed out at the step (b6), and the steps (b1) to (b7) are executed in this order.

FIG. 2 shows that after the first inspection, that is, the resist pattern inspection at the step (b3) is executed, only the lacking-fault 32 is repaired among the resist residue-fault 31 and the lacking-fault 32, and the resist pattern is sent to the next step, and the next inspection, that is, the inspection at the step (b6) is executed, and the metal residue-fault 21 caused by the resist residue-fault 31 and the etching remnant 22 are repaired, and then the resist pattern is sent to the next step.

To accomplish the above object, another embodiment of the method for producing a multi-layer thin film substrate of the present invention will be explained with reference to FIG. 3 and FIG. 4. The characteristics of this constitution are that the metal film which will be formed as circuit lines has a three-layer structure that it is sandwiched between other protective metal films, and the resist pattern is used not only as a mask for etching a metal film but also as a "stencil" for letting the metal plating grow, and no post-baking is executed. The embodiment will be explained hereunder in the order of steps with reference to the drawings. The embodiment consists of the following steps:

(c1) step for covering the thin metal film surface which will be formed as circuit lines with another thin metal film;

(c2) step for coating a photoresist on the other thin metal film which is covered on the thin metal film surface which will be formed as circuit lines at the step (c1);

(c3) step for exposing and developing the photoresist so as to form a hole pattern;

(c4) step for inspecting the hole pattern which is formed at the step (c3) by using a first inspection apparatus having a lighting means and a detector for optically detecting the image of the hole pattern and a recognition means for recognizing a faulty part from the pattern image which is detected by the lighting means and detector and pointing out at least the location of a hole pattern lacking-fault among a hole pattern residue-fault and hole pattern lacking-fault which exist in the hole pattern;

(c5) step for repairing the faulty part on the basis of the information of the location of the faulty hole pattern which is pointed out at the step (c4);

(c6) step for masking the hole pattern which is repaired at the step (c5) and etching only the other thin metal film which is covered on the thin metal film surface which will be formed as circuit lines at the step (c1) so as to expose the thin metal film which will be formed as circuit lines;

(c7) step for inspecting the circuit line metal pattern by using a second inspection apparatus having a lighting means and a detector for optically detecting the image of the circuit line metal pattern and a recognition means for recognizing the pattern image which is detected by the lighting means and detector and pointing out the location of the residue fault of the other thin metal film which is etched at the step (6c);

(c8) step for repairing the faulty part on the basis of the information of the location of the fault of the other thin metal film which is pointed out at the step (c7); and (c9) step for constructing a columnar metal by plating in the hole pattern of the photoresist, and the steps (c1) to (c9) are executed at least once in this order. In FIG. 3 and FIG. 4, numeral 10 indicates a ceramic base substrate, 25 a circuit line metal film, 40 a protective metal on the circuit line metal film 25, 41 a protective metal under the circuit line metal film 25, and 35 a resist. FIG. 3 shows the status that a residue-fault 36 and a lacking-fault 37 are generated in the resist. In FIG. 3, the status that at the repair step ((c5)) after the first inspection step ((c4)), only the lacking-fault 37 is repaired among the resist faults 36 and 37 is shown. After repair, the processing goes to the next step of etching ((c6)). Numeral 46 indicates a metal film residue-fault which is caused by the resist residue-fault 36 which is not repaired before and 47 an etching remnant which is generated during etching. At the inspection step ((c7)) after etching, the metal film faults 46 and 47 are pointed out and they are repaired at the next repair step ((c8)) and a fault-free status is generated. Thereafter, the processing goes to the step for forming a columnar metal by plating and then to FIG. 4. When the plating is finished, the resist in the plating form is peeled off and then a resist 60 is coated so as to etch the three-layer metal film (41, 25, 40), prebaked, and patterned by exposure and developing. The three-layer metal film is etched using the resist pattern as a mask. The resist is peeled off and then polyimide is coated on the three-layer metal film, baked, and polished for smoothing. Thereafter, the processing is returned to FIG. 3 and then FIG. 3 and FIG. 4 are repeated alternately so as to form a multi-layer structure.

As to the aforementioned thin film producing method or the aforementioned multi-layer thin film substrate producing method, more in detail, at the step for inspecting the resist pattern or hole pattern at the step (a3), (b3), or (c4), the lighting for optically detecting the image of the resist pattern or hole pattern is executed under the condition that the photoresist coated at the step (a1), (b1), or (c2) is not exposed to light.

Still in detail, by irradiating excitation light whose wave length and intensity are adjusted so that the photoresist coated at the step (a1), (b1), or (c2) is not exposed by it and detecting the resist pattern or hole pattern as a fluorescent image, at the step for inspecting the resist pattern or hole pattern at the step (a3), (b3), or (c4), the photoresist is prevented from exposure by the light.

In detail, at the step for inspecting the resist pattern or hole pattern at the step (a3), (b3), or (c4), when the intensity and lighting time of the light which is irradiated by the lighting means are checked and the lighting energy expressed by the light intensity × lighting time exceeds the specified value, the aforementioned first inspection apparatus having a resist exposure prevention function for closing the shutter of the lighting means or saving the resist pattern during inspection is used.

Still in detail, at the step for inspecting the resist pattern or hole pattern at the step (a3), (b3), or (c4), when the aforementioned first inspection apparatus points out the residue-fault of the resist pattern or hole pattern, the wave length and intensity of the light of the inspection apparatus are switched to the condition under which the resist is exposed the light, and the faulty part is locally exposed by light, and then the pattern is developed so as to be repaired.

To accomplish the above object, in the aforementioned multilayer thin film substrate manufacturing method, more in detail, at the step for inspecting the hole pattern at the step (c4), the lighting for optically detecting the image of the hole pattern is executed under the condition that the photoresist coated at the step (c2) is not exposed by light and at the etching step (c6), an etching solution by which the photo-sensitive part of resist is dissolved is used.

In detail, in the multi-layer thin film substrate manufacturing method, the resist is not hard-baked particularly.

In detail, at the step for inspecting the residue-fault of the hole pattern at the step (c4), the reflected light in the wave length range in which the difference in the reflecting power between the aforementioned thin metal film which will be formed as circuit lines and the aforementioned other thin metal film which is covered on it is large is detected, and the existence of the other covered thin metal film is actualized, and the residue-fault of the hole pattern is detected.

Still in detail, at the step for inspecting the residue-fault of the other thin metal film at the step (c7), two linear image sensors which are lined up closely in parallel are used as a detector and the two linear image sensors are arranged so that the reflected light from an inspection object is separated into two wave length ranges so as to be focused separately. An output signal from one linear image sensor is delayed by predetermined timing, and the first output value of the output signal is divided by the output value of the other output signal, and the existence of the other thin metal film which is covered on the thin metal film which will be formed as circuit lines is actualized by the division result, and the residue-fault is detected.

As to the material to be used, more in detail, Cu is used as the thin metal film which is described at the step (c1) and will be formed as circuit lines, and Cr is used as the other thin metal film which is covered on the surface thereof at the step (c2), and a positive type resist is used as the photoresist described at the step (c2), and an alkaline solvent is used so as to execute the etching described at the step (c6).

According to the present invention having the aforementioned constitution, at the step for patterning a resist by exposure and developing, that is, at the step that the first inspection and repair are executed and then the base layer is patterned by etching, the second inspection and repair are executed.

Therefore, compared with the case that only one inspection and repair are executed, there is a higher possibility that a fault in the pattern is detected by inspection and repaired and the yield for production can be improved. Particularly from the viewpoint of making good use of the other steps so as to prevent faults, it is valid in a method for producing a multi-layer circuit substrate which is produced via many steps.

According to the present invention having the aforementioned constitution, at the first inspection and repair step, a resist lacking-fault is inspected and repaired and at the second inspection and repair step, a base layer residue-fault is inspected and repaired. Therefore, when the resist pattern is inspected and the lacking-fault is repaired before the base layer is etched, the base layer can be made free of a residue-fault. The reason is that there is no cause of generating a lacking-fault of the base layer other than a resist lacking-fault. Furthermore, when the pattern of the base layer is inspected after the etching ends and the detected residue-fault is removed and repaired, no fault is left behind and the yield of substrates can be improved. Particularly when a columnar metal to be used as a VIA is constructed by plating, there is the following relation of cause and effect available.

Resist lacking-fault → base layer lacking-fault → VIA residue-fault, or resist residue-fault → base layer residue-fault → VIA lacking-fault.

A VIA which is formed by plating is thicker (taller) than the base layer. Namely, the extent of fault becomes worse, so that this method is particularly effective.

As mentioned above, according to the present invention, inspection and repair are executed at two steps, so that even when a thin resist remnant which is a residue-fault is missed in the resist pattern inspection, it is detected and repaired by the subsequent base layer pattern inspection and no failure will be generated.

Explaining more in detail, this operation which is special to the present invention is that inspection and repair can be executed efficiently by utilizing the special properties of two types of faults. Namely, as mentioned above, repair of a base layer lacking-fault is generally difficult because it requires a long period of time and high reliability compared with those of a residue-fault. Therefore, in the method relating to the present invention as mentioned above, when the resist pattern is inspected and a resist lacking-fault is repaired before the base layer is etched, only a residue-fault is repaired at the step for repairing the base layer, so that the difficulty of repair of a lacking-fault will not come into a problem. Therefore, repair of a lacking-fault of the base layer which is technically difficult can be eliminated and accordingly the repair step can be executed efficiently in a short time.

From a viewpoint of inspection, inspection is executed at two steps as mentioned above, so that a fault which is missed in the first inspection is detected in the second inspection and as a result, it can be expected that no fault will be missed. Therefore, the rate of faults which are not repaired is reduced, and no faults are left behind, and the yield of substrates will be improved.

The embodiments relating to the present invention will be explained in detail hereunder with reference to FIG. 2 to FIG. 17.

The outline of each embodiment and the flow of steps will be explained first and then each step will be explained in detail.

Embodiment 1

An embodiment relating to the present invention will be explained hereunder with reference to FIG. 2.

FIG. 2 is a schematic diagram showing the flow of the lithography process relating to an embodiment of the present invention.

The steps will be explained hereunder sequentially according to the drawing.

Firstly, a metal film 20 which is to be processed, for example, an aluminum film is formed on a multi-layer ceramic substrate 10 (a size of, for example, about 200 mm×200 mm) by sputtering. Alternatively the aluminum film may be formed by another method such as vacuum vapor deposition.

Next, a resist 30, for example, a micro fabrication standard positive type photoresist OFPR-800 (Tokyo Oka Kogyo K.K.) is coated on it, prebaked, and patterned by exposure and developing. The cross sectional view of the workpiece shown in FIG. 2 shows the status that a residue-fault 31 and a lacking-fault 32 are generated in the resist pattern.

Next, the resist pattern is inspected and a fault is repaired on the basis of the inspection result. When a residue-fault 31 is detected by the inspection, the residue-fault 31 is repaired. However, according to the substance of the invention, a faulty part which is to be detected and repaired is a lacking-fault 32. In this embodiment, assuming that only a lacking-fault 32 is detected, only the lacking-fault 32 is repaired.

After repair, the resist pattern is postbaked. The reason for executing inspection and repair before starting postbaking is that when there are too many parts to be repaired and it is better to peel off the resist and retry patterning rather than repair, room for peeling off the resist is left. Namely, when the resist pattern is postbaked, the resist is hardened and adheres closely to the base metal film strongly, so that it cannot be peeled off easily.

Next, the metal film 20 is etched. The cross sectional view of the workpiece shown in FIG. 2 shows a status that an etching remnant 21 due to the residue-fault 31 of an unrepaired resist and an etching remnant 22 due to another cause are generated.

Next, the resist is peeled off, and the metal pattern is inspected, and the etching remnants 21 and 22 are detected. As the drawing shows, in this stage, there is no difference the etching remnants 21 and 22 that are generated by the residue-fault 31 of the unrepaired resist and that they are generated by another cause.

Next, when both the etching remnants 21 and 22 are removed and repaired, it results in that all the faults are repaired.

When multi-layer thin film substrates are produced, the lithography process is repeated several times. Therefore, when each lithography process is made as indicated in this embodiment, no faults are accumulated and the yield of substrates is improved.

According to this embodiment, since the resist pattern lacking-fault is repaired already, as to repair of the metal pattern, only a residue-fault which can be repaired easily may be repaired and it can be prevented to give up repair and abort the substrate.

According to this embodiment, even when a thin residue-fault such as a resist remnant is missed in the resist pattern inspection, it is detected and repaired as a residue-fault of the metal pattern later and no failure will be generated. As a thin metal film, a material which is conventionally used to form a circuit line pattern, such as gold, copper, chromium, or suitable alloy may be used. A positive type photoresist is used in the aforementioned embodiment. However, a negative type photoresist, for example, a standard negative type photoresist OMR-83 (Tokyo Oka Kogyo K.K.) may be used.

Embodiment 2

The second embodiment relating to the present invention will be explained hereunder with reference to FIG. 3 and FIG. 4. FIG. 3 is a schematic diagram showing the flow of the lithography process relating to another embodiment of the present invention.

Figure 3:
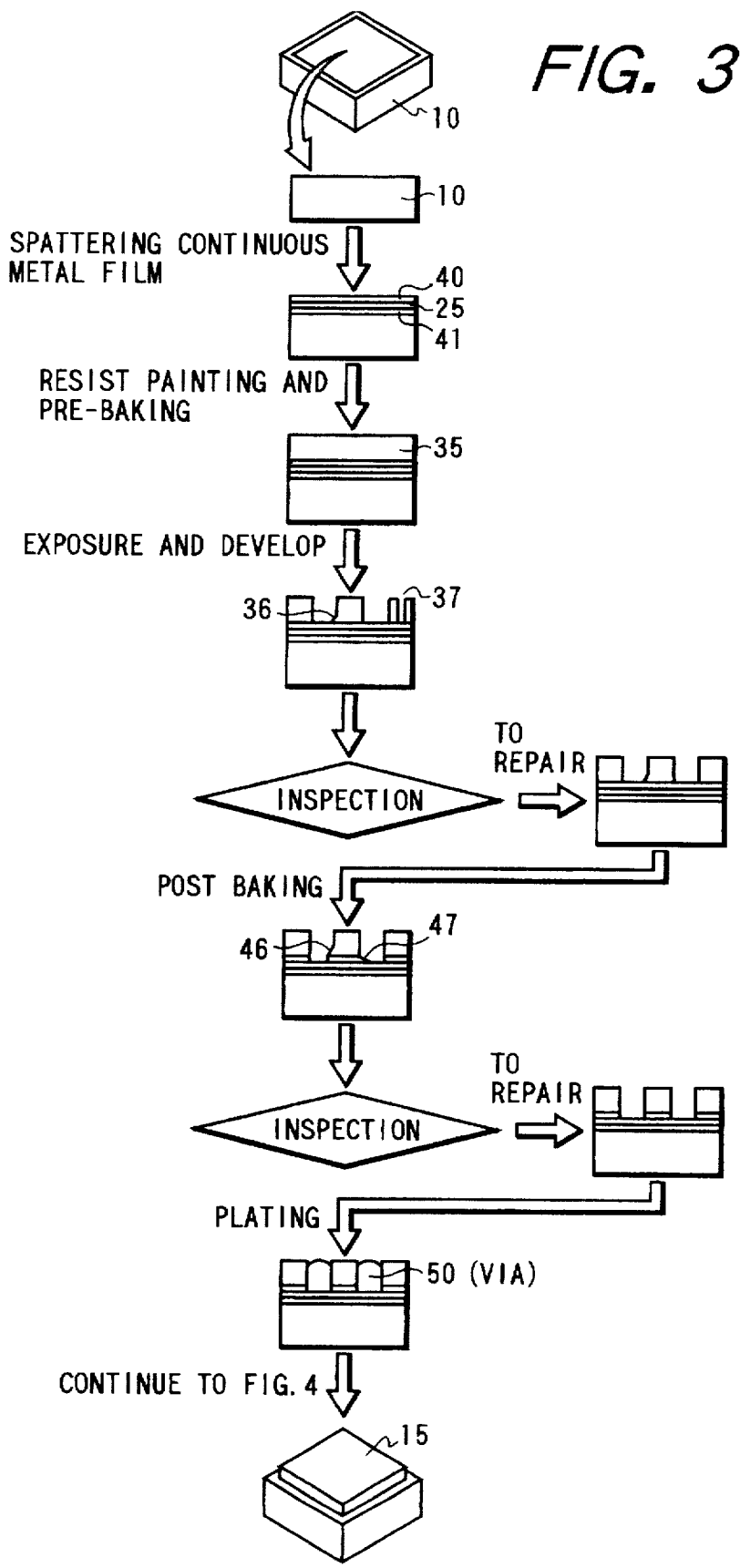
FIG. 3 is a schematic diagram showing the flow of the lithography process relating to another embodiment of the present invention.
Figure 4:
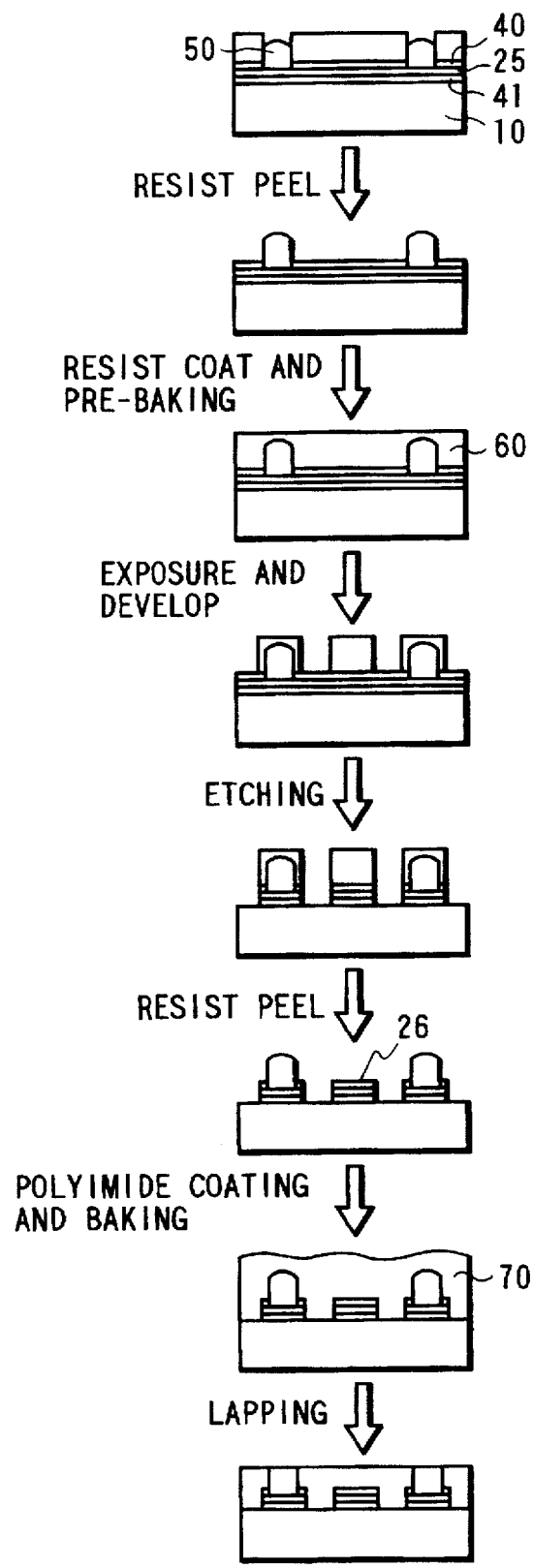
FIG. 4 is a schematic diagram showing the flow of the process for forming a VIA layer following the process shown in FIG. 3 relating to another embodiment of the present invention.

FIG. 4 is a schematic diagram showing the flow of the process for forming a VIA layer following the process shown in FIG. 3 relating to another embodiment of the present invention.

Differences from the first embodiment are that the metal film which will be formed as circuit lines has a three-layer structure that it is sandwiched between protective metal films, and the resist pattern is used not only as a mask for etching a metal film but also as a "stencil" for letting the metal plating grow, and no post-baking is executed.

The steps will be explained hereunder sequentially according to the drawing.

Firstly, on a multi-layer ceramic base substrate 10 (a size of, for example, about 200 mm×200 mm), a lower protection metal film 41, a metal film 25 which will be formed as circuit lines, and an upper protection metal film 40 are formed by continuous sputtering (Step a). As a protection metal, for example, chromium is used and as a circuit line metal, for example, copper is used. The reason of forming such a three-layer structure is that since copper reacts to an insulating film material of a multi-layer thin film substrate, for example, polyimide, another metal which will function as a barrier is necessary.

Next, on the three-layer metal film, a resist 35, for example, a high precision plating positive type photoresist AZLP-10 (manufactured by Hoachst, Ltd.) is coated, prebaked, and patterned by exposure and developing. The cross sectional view of the workpiece shown in FIG. 3 shows the status that a residue-fault 36 and a lacking-fault 37 are generated in the resist pattern.

Next, the resist pattern is inspected. In this embodiment, by the reason which will be described later, it is noted that the inspection is executed under the condition that the resist will not be exposed by the inspection light.

Next, a fault is repaired on the basis of the inspection result. Also in this embodiment, in the same way as with the first embodiment, repair of the lacking-fault is important, so that the cross sectional view of the workpiece shown in FIG. 3 shows the status that only the lacking-fault 37 is repaired. In this embodiment, no postbaking is executed. The reason is that when postbaking is executed, the corner of each edge of the resist pattern is rounded by heat, so that the resist pattern cannot be used as a "stencil" for plating at the subsequent step k.

After the resist is repaired, the upper protection metal film 40 is etched (Step h). As an etching solution, a potassium ferri-cyanide solution which dissolves protection metal chromium, but not circuit line metal copper, is used.

The reason that the inspection is executed at the step f under the condition that the resist is not exposed by the inspection light is that when the resist is exposed to light in the inspection, the part which is not intended to be etched may also be etched due to the exposure. It is because the potassium ferri-cyanide solution is alkaline and has an operation for etching the photosensitive part of a positive type resist.

Namely, the photosensitive part of a positive type resist which is not postbaked is not resistant to an alkaline solution.

The cross sectional view of the workpiece shown in FIG. 3 shows the status that an etching remnant 46 due to the residue-fault 36 of an unrepaired resist and an etching remnant 47 due to another cause are generated as a result of etching.

Next, the second inspection is executed (Step i) and the etching remnants 46 and 47 are detected as unexposed parts of the circuit line metal and removed and repaired (Step j).

After the circuit line metal is put into the correctly exposed state in the resist hole pattern as mentioned above, the circuit line metal film 25 is electroplated as a power supply unit (Step k) and a columnar metal 50 which will be a VIA for connecting circuit lines on each layer later is formed in the resist hole pattern.

After the above steps are executed, for example, by the method as shown in FIG. 4, a circuit line pattern and VIA for one layer are formed and the process is returned to the step a shown in FIG. 3. When this processing is repeated, a multi-layer thin film pattern will be formed.

Since no faults are accumulated also in this embodiment in the same way as with the first embodiment, the yield of substrates is improved.

When inspection is executed under the condition that no resist is exposed to light as shown in this embodiment, an etching solution can be selected freely without minding the resistance of the resist to it. In this embodiment, a columnar VIA is formed by electroplating at the step k. However, it may be formed by another method, for example, chemical plating.

DETAILED EXPLANATION OF THE RESIST PATTERN INSPECTION PROCESS (I) Condition under which a resist pattern is not exposed to light Firstly, the condition under which a resist pattern is not exposed by inspection light will be explained with reference to FIG. 5.

Figure 5A:
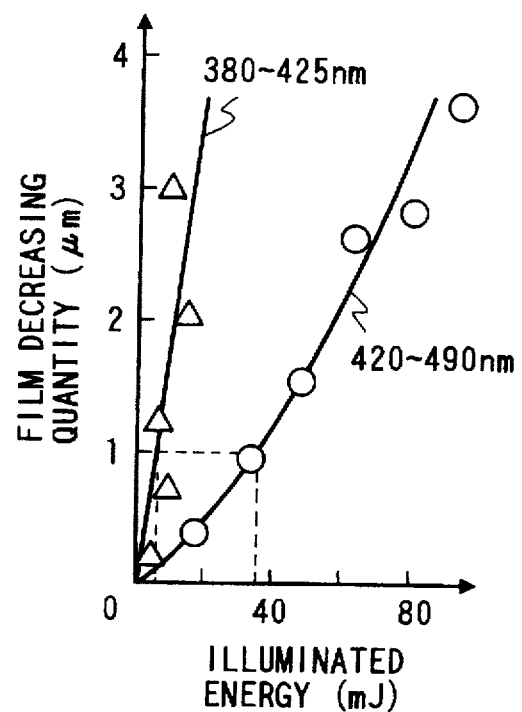
FIGS. 5(a) and 5(b) are graphs showing the relationship between the lighting energy and film decreasing quantity for each lighting wave length.
Figure 5B:
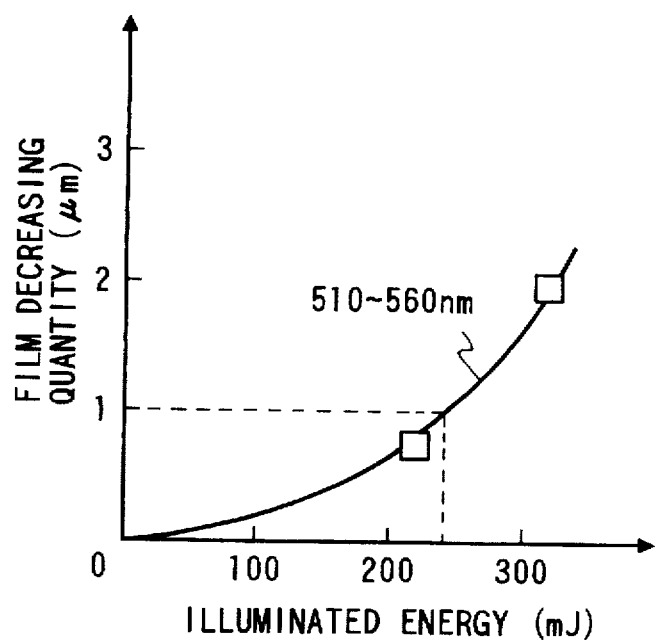

FIG. 5(a) and FIG. 5(b) are graphs showing the relationship between the lighting energy and film decreasing quantity for each lighting wave length.

Firstly, the meaning of the condition under which a resist pattern is not exposed by inspection light will be explained.

When a negative type resist whose photosensitive part is insoluble in a developing solution is exposed by light, hardening is caused by a polymerization reaction inside. When a positive type resist whose photosensitive part is soluble in a developing solution is exposed by light, a decomposition reaction is caused inside.

When a positive type resist is exposed by light, for example, as described in the second embodiment of the aforementioned multi-layer thin film substrate producing method, a problem is imposed that it does not resist a certain etching solution (alkaline solution) and cannot play a part as an etching mask.

When there is a step for executing postbaking before etching (for example, as shown in FIG. 2), this developing is not questionable regardless of a negative type resist or a positive type resist. However, there is another problem imposed. When a photoresist is exposed by light, a polymerization or decomposition reaction is caused. However, it is accompanied by discoloration (hereinafter referred to as fading). When fading is caused during inspection, a detection image is adversely affected naturally and stable fault detection is disturbed.

Therefore, in all cases, it is important that a resist pattern is inspected so that the resist is not exposed by light.

Next, the condition under which a resist pattern is not exposed by light will be explained concretely on the basis of the experiment conducted by the inventor.

In the experiment conducted by the inventor, the lighting energy is allocated in various ways in the three wave length ranges of violet (380 to 424 nm), blue (420 to 490 nm), and green (510 to 560 nm), and the resist is irradiated by light and developed, and the degree of exposure is checked from the film decreasing quantity due to developing (the decreasing length of the film width by developing). The sample is a one that a high precision plating positive type photoresist AZLP-10 (manufactured by Hoachst, Ltd.) which is the same as that used in the second embodiment is coated overall a glass plate and prebaked. For developing, a dedicated developing solution on sale is used.

FIG. 5(a) and FIG. 5(b) show the results thereof and the horizontal axis represents a quantity of lighting energy and the vertical axis represents a film decreasing quantity. Assuming that when the film decreasing quantity is less than 1 um, it can be considered that the resist pattern is not exposed by light, the nonexposure condition is as shown in Table 1. The nonexposure condition greatly varies with the lighting wave length, that is, as the lighting wave length becomes shorter, the condition becomes severer. The table shows that to prevent a resist from exposure, light with a wave length as long as possible, for example, in a wave length range of at least 500 nm is to be irradiated.

(II) Resist pattern inspection apparatus

Next, the resist pattern inspection apparatus relating to the embodiments of the present invention will be explained in detail with reference to FIG. 6 to FIG. 8.

Figure 6:
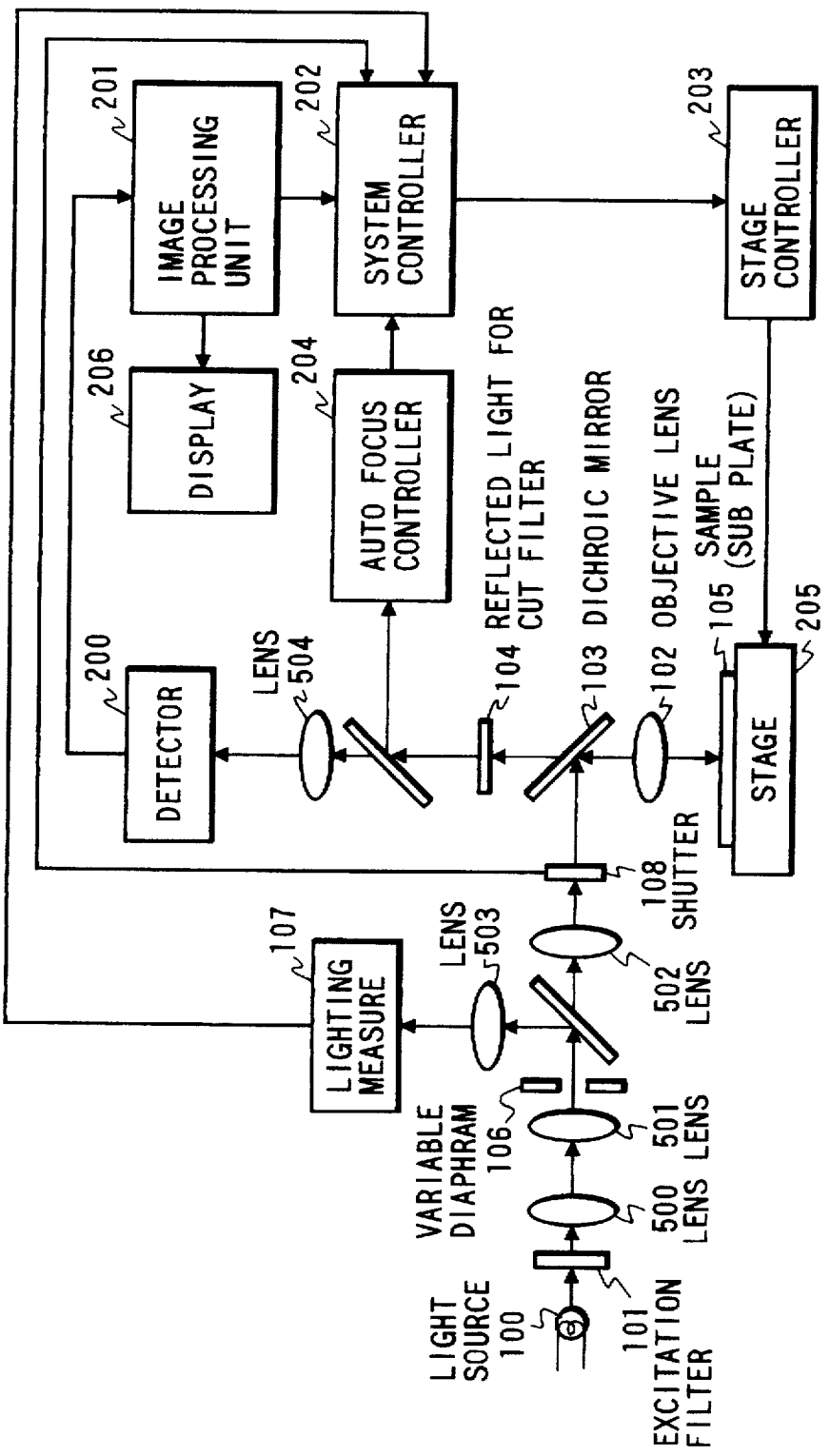
FIG. 6 is a block diagram for explaining the operation of a resist pattern inspection apparatus relating to the embodiments of the present invention.

FIG. 6 is a block diagram for explaining the operation of a resist pattern inspection apparatus relating to the embodiments of the present invention.

Figure 7:
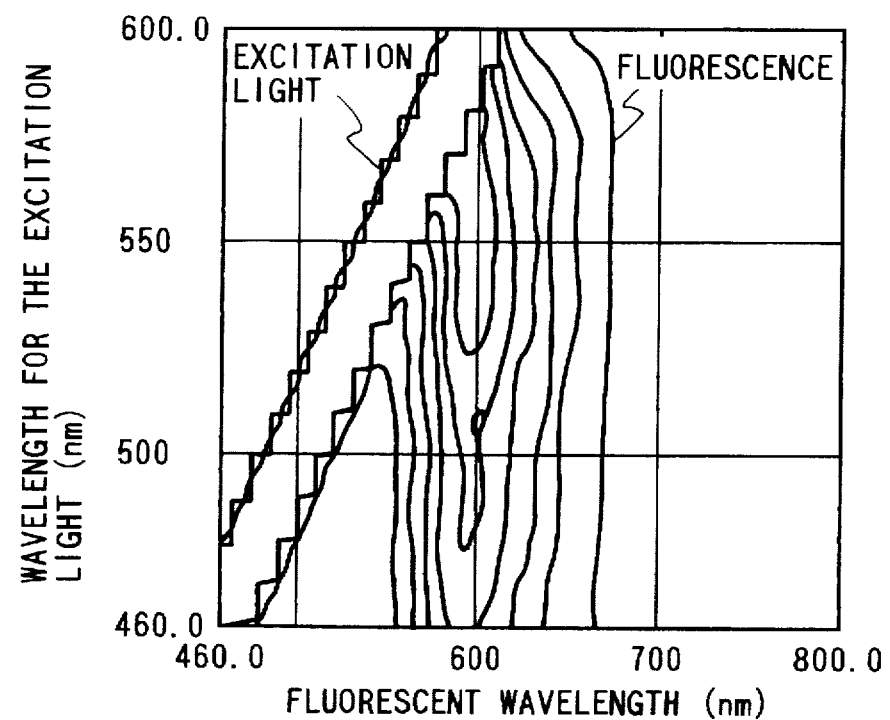
FIG. 7 is a graph showing the intensity characteristics of excitation light and fluorescence in the relationship between the fluorescent wave length and the wave length of excitation light.

FIG. 7 is a graph showing the intensity characteristics of excitation light and fluorescence in the relationship between the fluorescent wave length and the wave length of excitation light.

Figure 8:
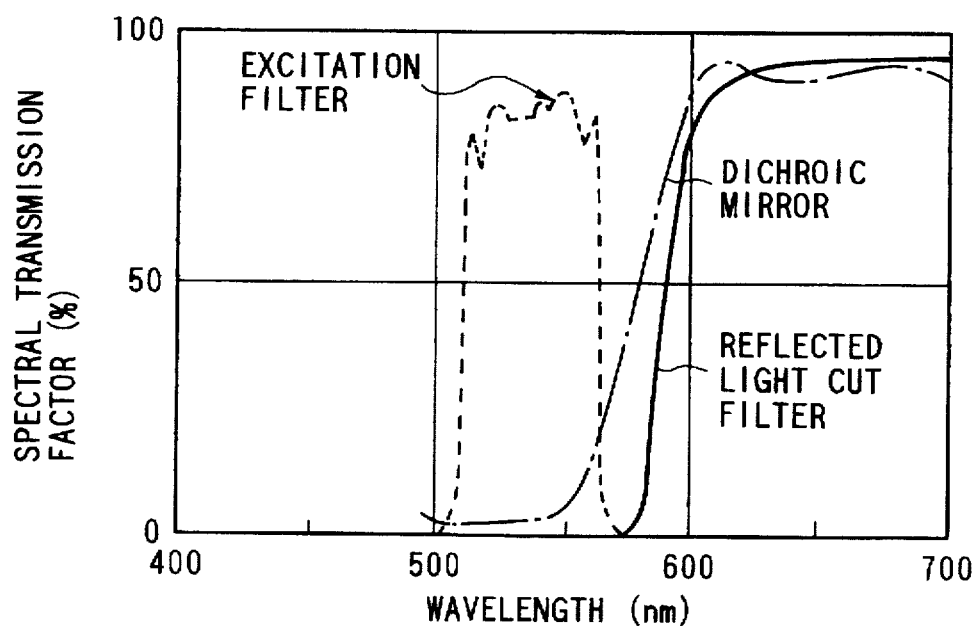
FIG. 8 is a graph showing the relationship between the wave length and spectral transmission factor of an excitation filter, dichroic mirror, and reflected light cut filter.

FIG. 8 is a graph showing the relationship between the wave length and spectral transmission factor.

This resist pattern inspection apparatus inspects a resist pattern by fluorescence detection for irradiating light (excitation light) with a specific wave length to a sample, detecting fluorescence emitted from the resist, and obtaining a resist pattern image.

Firstly, the intensity characteristic of fluorescence in the relationship between the fluorescent wave length and the wave length of excitation light will be explained. FIG. 8 shows the results when the fluorescent spectral characteristic of photoresist AZLP-10 is measured by a spectral fluorescent photometer F-4500 (Hitachi, Ltd.). The wave length of excitation light is represented by the vertical axis, and the fluorescent wave length detected is represented by the horizontal axis, and the relative fluorescent intensity is indicated by a contour line. The peak of the fluorescent intensity is in the neighborhood of the wave length of excitation light 550 nm and the fluorescent wave length detected 600 nm. This indicates that when light with a wave length of about 550 nm is used as excitation light, the fluorescent generation efficiency is high and the generated fluorescence is distributed centering on the wave length 600 nm. This wave length of excitation light is included in the lighting wave length range of at least 500 nm which is described in Item (I) and in which it is difficult to expose a resist by light, so that efficient detection of fluorescence and prevention of exposure of a resist can be compatible with each other. FIG. 5, Table 1, and FIG. 7 show experimental results of the specific photoresist AZLP-10. However, the investigation result shows that also for the greater part of positive type resists, efficient detection of fluorescence and prevention of a resist from exposure can be compatible with each other. Therefore, it may be said that fluorescence detection is a method suited to inspection by keeping a resist away from exposure.

In FIG. 6, an excitation filter 101 is a filter for limiting the wave length of light emitted from a light source 100. For example, when the inspection object is AZLP-10 mentioned above, a filter which transmits only light with a wave length between 510 and 560 nm is used.

A variable diaphragm 106 is in the optical conjugation position between the sample surface and the sensor surface of the detector and limits the lighting range in accordance with the detection area of the sensor. The object thereof is to prevent areas other than the detection area of the sensor from exposure to unnecessary light and to minimize the total amount of lighting energy irradiated to the resist.

A lighting measure 107 is used to monitor changes in the lighting intensity due to a defective operation of the light source or variable diaphragm. When the lighting intensity exceeds a specified value, a shutter 108 is closed immediately so as to prevent the resist from exposure. By moving a stage 205 by a stage controller 203 so as to save the inspection object, the resist can be prevented from exposure. Furthermore, the lens is arranged so that the lighting becomes as Kohler lighting so as to make the lighting intensity in the field of view as uniform as possible.

The excitation light whose wave length is limited is irradiated down to a substrate with resist pattern 105 via a dichroic mirror 103 and an objective lens 102.

Only the fluorescence among the reflected light and fluorescence from the resist pattern passes through the dichroic mirror 103. The dichroic mirror is a mirror which reflects light with a wave length shorter than the specific wave length and passes light with a wave length longer than it. A half mirror is generally used for normal reflected light detection. When a dichroic mirror is used for fluorescence detection, both the lighting and fluorescence will not be lost.

Figure 9:
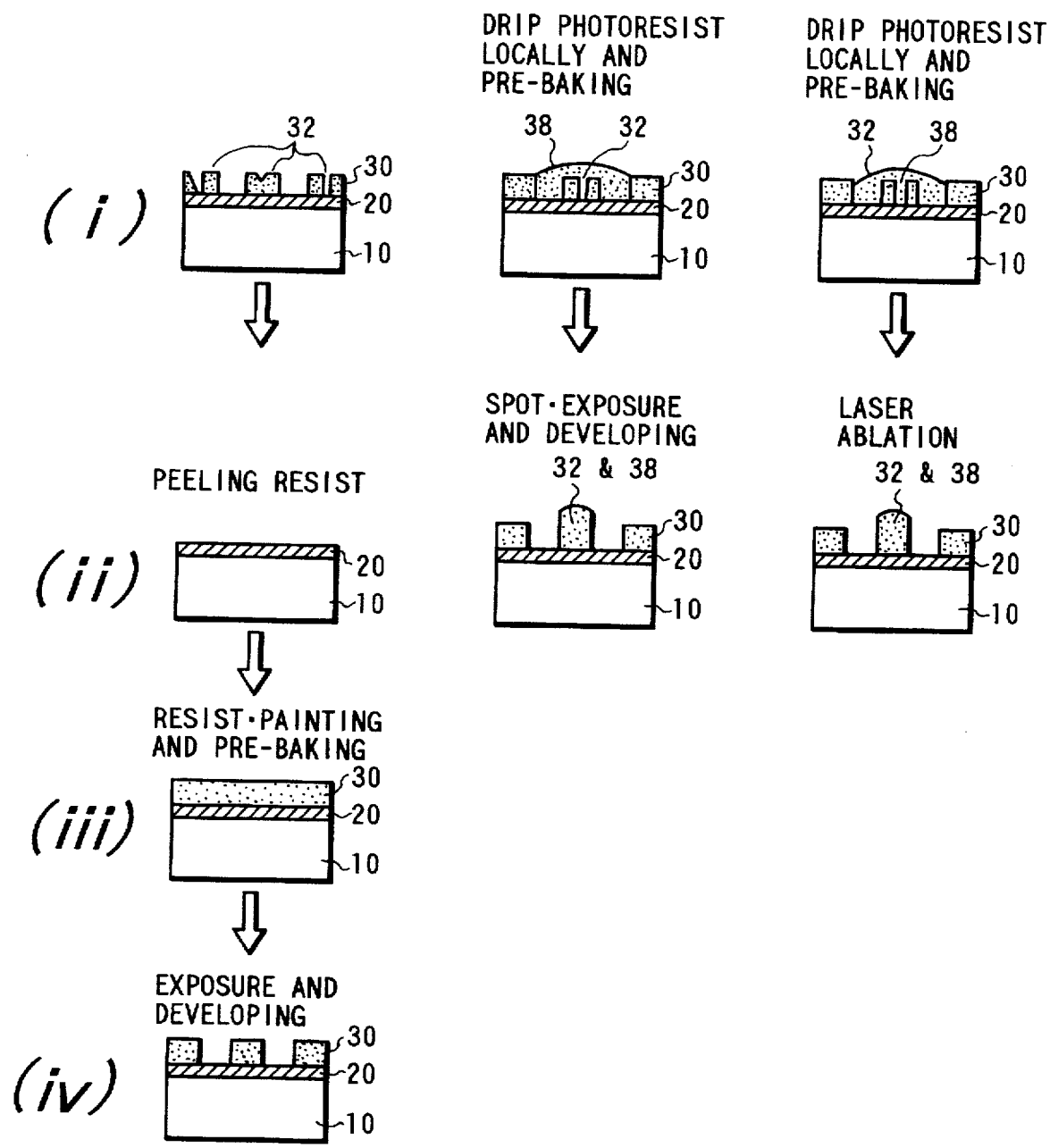
FIGS. 9(a), 9(b), and 9(c) are cross sectional views of a workpiece in each process so as to explain the repair method for a resist lacking-fault for each kind.

As mentioned above, the fluorescence is distributed centering on the wave length 600 nm. The light passes through a reflected light cut filter 104 and focuses on a detector 200. The reflected light cut filter 104 is inserted because the reflected light (light with a wave length between 510 and 560 nm) is not always removed sufficiently by the dichroic mirror 103. FIG. 9 shows the spectral transmission factors of the excitation light 101, the dichroic mirror 103, and the reflected light cut filter 104. From the drawing, it can be understood that each equipment can be operated in the suitable wave length range. As the light source 100, a mercury lamp or mercury xenon lamp which has an emission line spectrum and whose wave length range can be limited easily is suited. As the detector 200, a TV camera, a linear image sensor, or a TDI (time delay and integration) sensor consisting of a plurality of linear image sensors which are lined up in parallel can be used. Particularly, the TDI sensor can obtain the light quantity which is equal to the product of each light quantity multiplied by the number of linear image sensors which are lined up in parallel, so that it is valid in fluorescence detection for detecting fluorescence which is extremely weak compared with the reflected light. As a TDI sensor, for example, an apparatus in which 96 linear sensors of 512 to 2048 pixels are lined up in parallel is known.

A detected image by fluorescence is detected by light emission from the resist. Therefore, compared with an image by reflected light which takes on a complicated aspect by an effect of interference by the base or a level difference of a pattern, it is very simple and suited to pointing out a fault. As explained with reference to FIG. 2 or FIG. 3, an important point in the resist pattern inspection is to detect a resist lacking-fault. However, with a resist lacking-fault fluorescence is not detected in the part where it is to be detected, so that an image can be detected more surely compared with the method using a reflected light image.

Figure 1:
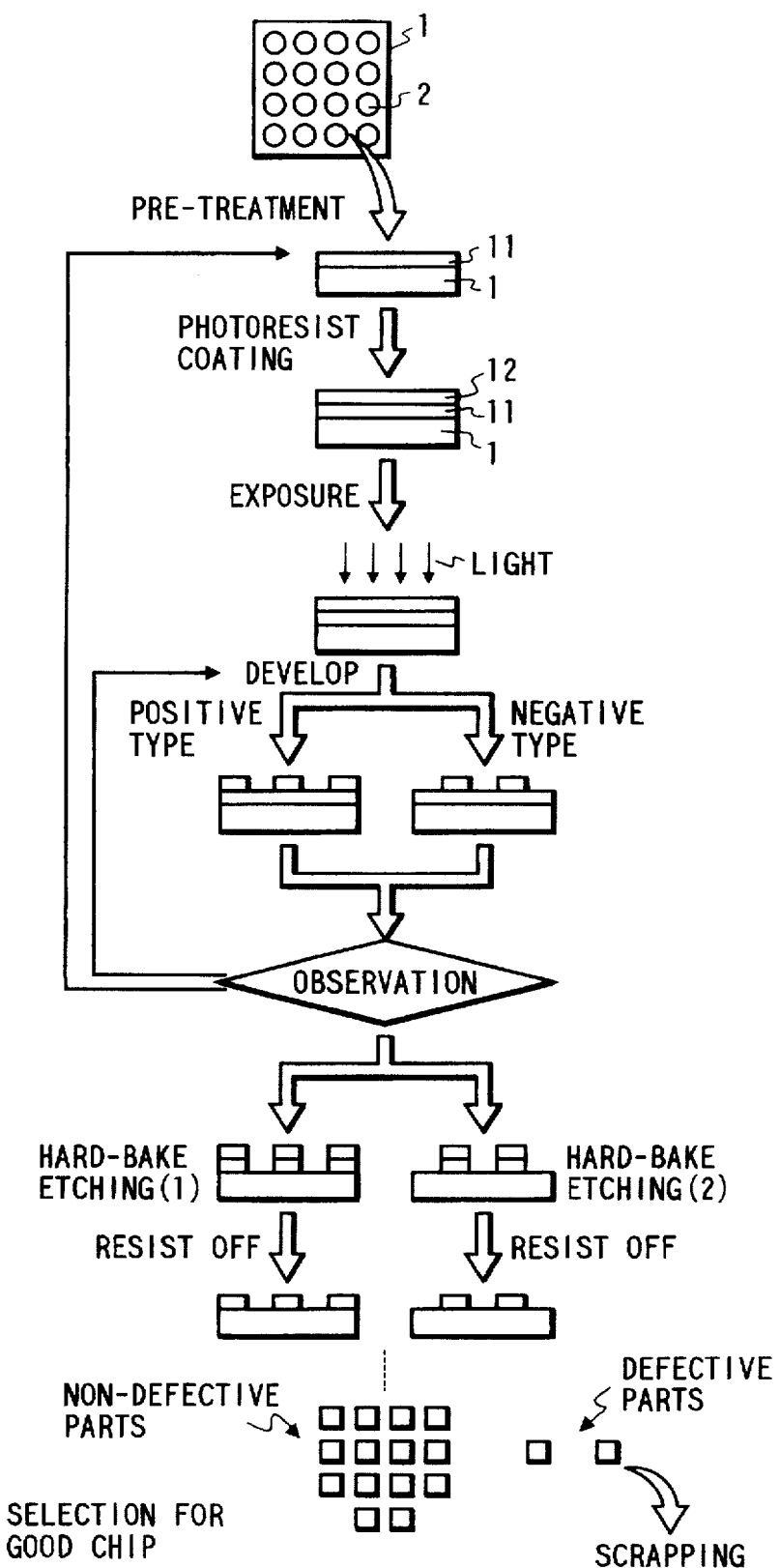
FIG. 1 is a schematic diagram showing the flow of the lithography process relating to the prior art.

The detected image obtained by the detector 200 is sent to a picture processing recognition apparatus 201 and a faulty part is detected by comparison with a good detected image, comparison with a pattern generated from the design data, or the character extraction method for deciding a part which is off a fixed pattern rule (for example, line width, area, distance from the neighboring pattern, etc.) as a fault. Detailed explanation of the resist pattern repair process which is executed at the step g shown in FIG. 1 and the step i shown in FIG. 3 will be explained in detail with reference to FIG. 9(a), FIG. 9(b), FIG. 9(c), and FIG. 10.

(I)' Type of repair method for a resist lacking-fault

First, the repair method for a resist lacking-fault will be explained for each type with reference to FIG. 9(a) to FIG. 9(c).

FIGS. 9(a), 9(b), and 9(c) are cross sectional views of a workpiece in each process so as to explain the repair method for a resist lacking-fault for each kind.

As explained in the first and second embodiments, the principal object of the present invention in this process is repair of a resist lacking-fault.

The repair method will be explained hereunder for each kind.

FIG. 9(a) shows a method for peeling off a resist and patterning it once again, which is applied when there are too many faults pointed out by the inspection apparatus.

FIG. 9(b) shows a method for dropping a positive type resist in a local area including a resist lacking-fault, exposing a projected unnecessary part locally so as to remove the unnecessary part, and then developing it.

FIG. 9(c) shows a method for dropping a resist in an area including a resist lacking-fault and removing a projected unnecessary part by laser ablation.

As to a resist to be used, it is to be a positive type photoresist in FIG. 9(b) so as to dissolve the exposed part at the time of developing. In FIG. 9(c), a positive type resist, a negative type resist, or polyimide may be used. In short, it is necessary to use a material which can be easily controlled so as to be dropped in a very small amount properly.

As to an apparatus for repair, since a resist residue-fault can be repaired by spot exposure and developing shown in the latter half of FIG. 9(b) or by laser ablation shown in the latter half of FIG. 9(c), a special apparatus is not necessary so as to repair a resist residue-fault and a repair apparatus for a lacking-fault which is normally used can be used for it.

Next, as to an apparatus for dropping resists 32 and 28 into the local areas in FIGS. 9(b) and 9(c) respectively, a combination of an injector for dropping a very small amount of solution, for example, a cell injector CIJ-1 (manufactured by Shimazu Seisakusho) and a stage for automatically moving a substrate so that the faulty part comes to the dropping position of the injector on the basis of the position data of the inspection result can be used. Next, as to an apparatus for spot exposure shown in FIG. 9(b), for example, the resist pattern inspection apparatus shown in FIG. 6 may be used. To inspect a resist pattern, the excitation light filter 101 for transmitting light in a wave length range in which no resist is exposed to light is installed on the light source side. When the filter is replaced with a filter which transmits light with a wave length at which a resist is exposed to light (for example, when a photoresist AZLP-10 is used, a filter which transmits light at a wave length between 400 and 450 nm), and the variable diaphragm 106 is switched to a very small rectangle, and the stage is scanned, only a necessary area can be exposed. However, it is necessary to preset the condition for a lighting energy amount necessary for exposure beforehand.

(II)' Apparatus for removing an unnecessary resist by laser ablation

Next, an apparatus for removing an unnecessary resist by laser ablation in FIG. 9(c) will be explained with reference to FIG. 10.

Figure 10:
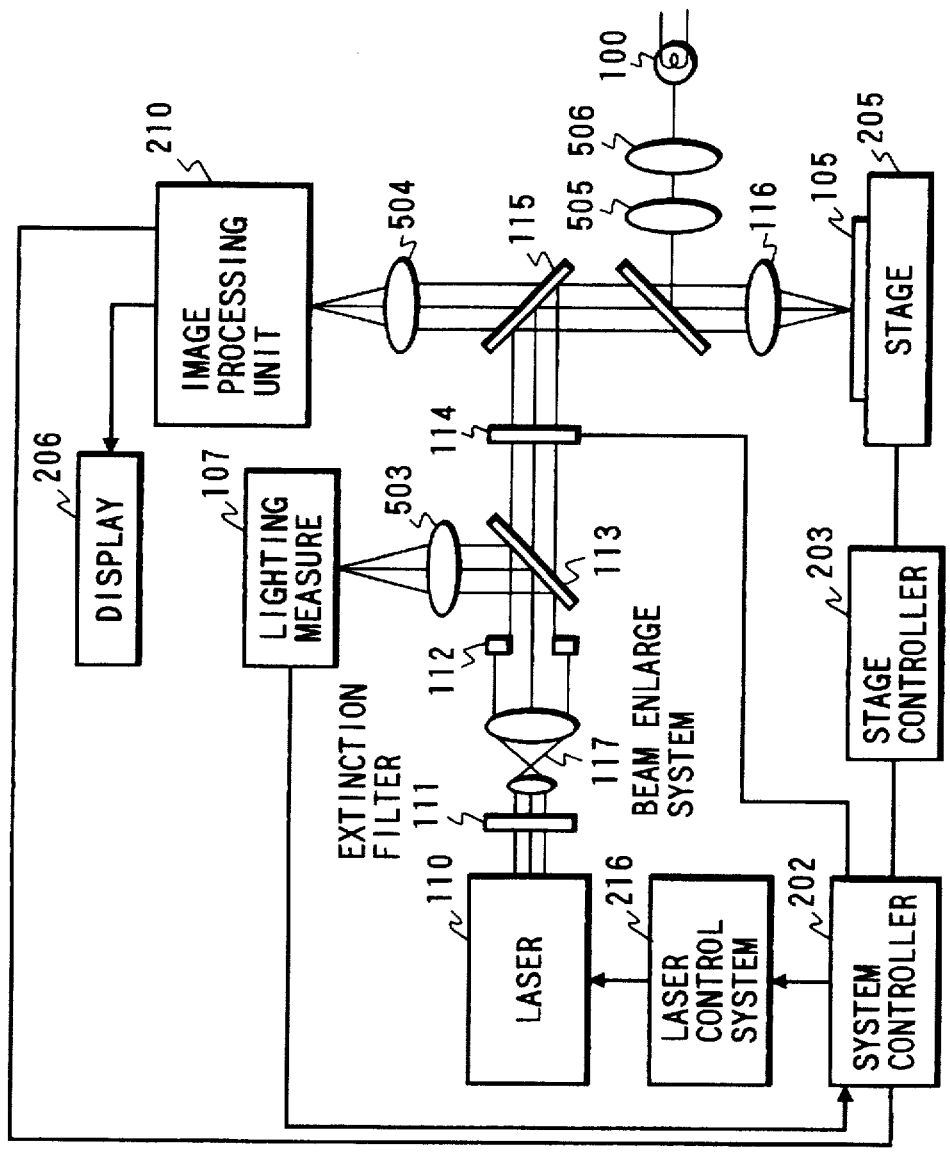
FIG. 10 is a schematic diagram for explaining the operation of an apparatus for removing an unnecessary resist by laser abrasion in the resist pattern repair process relating to the embodiments of present invention.

FIG. 10 is a schematic diagram for explaining the operation of an apparatus for removing an unnecessary resist by laser ablation in the resist pattern repair process relating to the embodiments of present invention.

Firstly, the stage 205 moves on the basis of the fault position data and the part to be repaired moves to the center of view field. The part to be repaired is lighted by the light source 100, and the faulty part is confirmed and focused by a TV camera 210.

On the other hand, a laser beam emitted from a laser optical source 110 is formed in the predetermined beam shape by a variable diaphragm 112 via an extinction filter 111 which conforms to the suitable standard. Thereafter, the laser beam passes a mirror 113 and reaches a shutter 114. The mirror 113 has a property of transmitting the greater part of the laser beam and reflecting a part thereof.

As to opening and closing of the shutter 114, until the aforementioned fault confirmation ends, the shutter 114 is kept closed. When the shutter is opened, the laser beam is reflected by a mirror 115 and comes in an objective lens 116. Numeral 117 indicates a beam enlarging system and 505 and 506 lenses for letting a beam from the light source 100 come in.

The resist on the part which is irradiated by the laser beam as mentioned above is scattered by an ablation phenomenon by the laser beam energy. A laser beam with a comparatively short wave length which is absorbed by a resist is acceptable and for example, an examiner laser beam, the 3rd or 4th harmonic of YAG laser, or the 2nd harmonic of Ar laser is used.

DETAILED EXPLANATION OF THE ETCHING REMNANT INSPECTION PROCESS (I) Etching remnant inspection method Next, the etching remnant inspection process which is executed in the process shown in FIG. 2 and the process shown in FIG. 3 will be explained with reference to FIG. 11 to FIG. 14.

Figure 11:
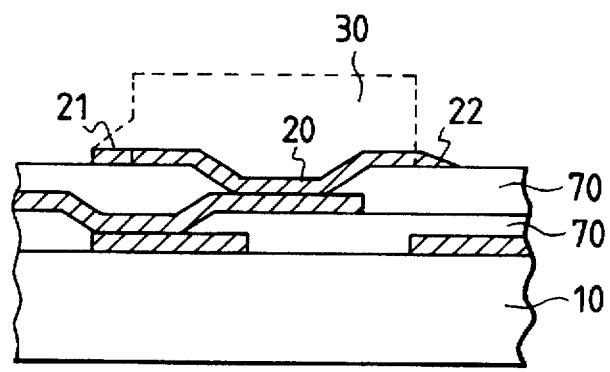
FIG. 11 is a cross sectional view of a workpiece which is an object of the etching remnant inspection.

FIG. 11 is a cross sectional view of a workpiece which is an object of the etching remnant inspection.

Figure 12:
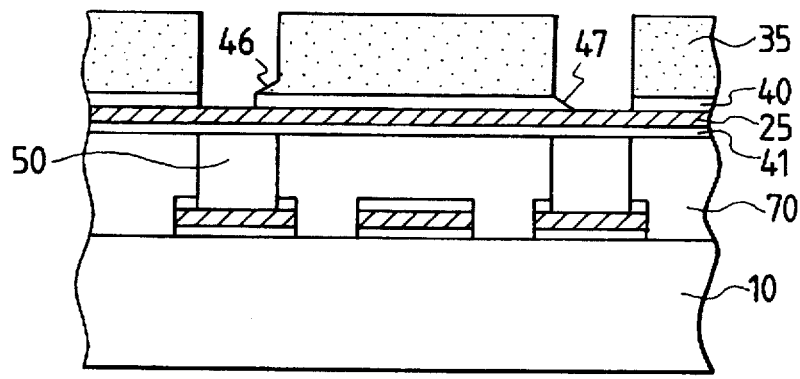
FIG. 12 is a cross sectional view of another workpiece which is an object of the etching remnant inspection and multilayered by using a VIA.

FIG. 12 is a cross sectional view of another workpiece which is an object of the etching remnant inspection and multilayered by using a VIA.

Figure 13:
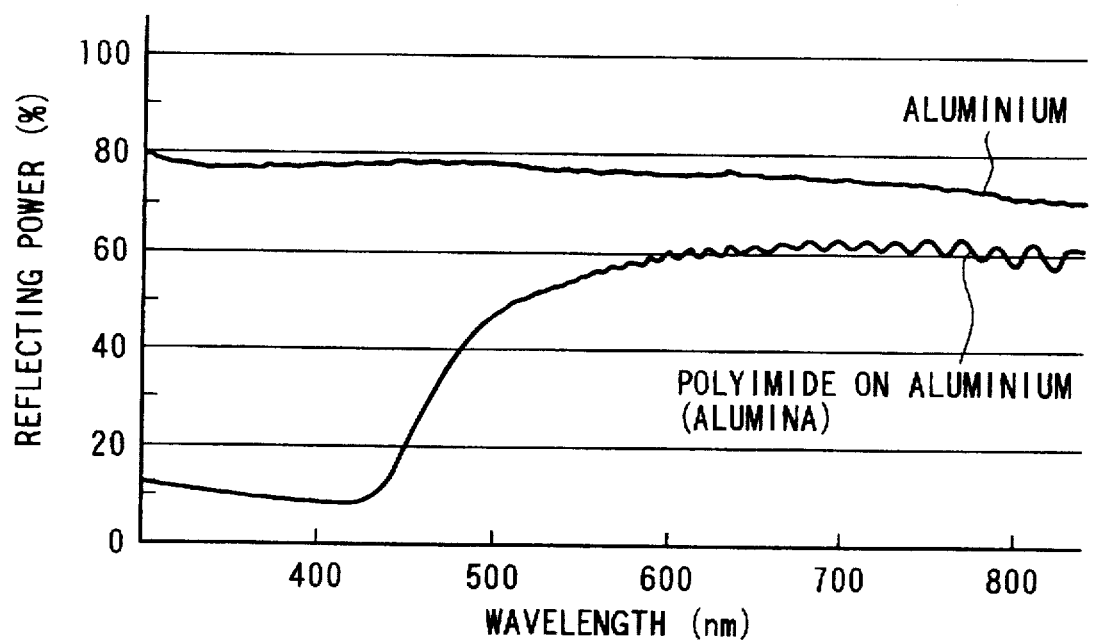
FIG. 13 is a graph showing the relationship between the wave length and reflecting power between aluminum and polyimide on aluminum.

FIG. 13 is a graph showing the relationship between the wave length and reflecting power between aluminum and polyimide on aluminum.

Figure 14:
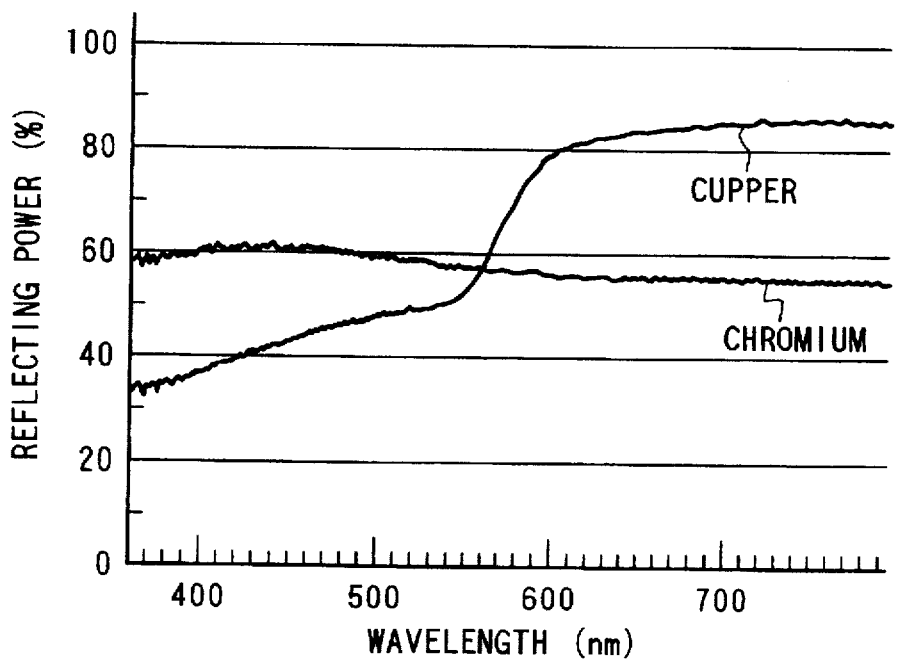
FIG. 14 is a graph showing the relationship between the wave length and reflecting power between copper and chromium.

FIG. 14 is a graph showing the relationship between the wave length and reflecting power between copper and chromium.

The process shown in FIG. 2 is a process for inspecting the residue part of a metal circuit line pattern on a ceramic base substrate or an insulating film (thin film 2nd layer and subsequent) as shown in FIG. 11 and the process shown in FIG. 3 is a process for inspecting the protection metal residue part on a circuit line metal in the resist hole pattern as shown in FIG. 12.

The method which is explained hereunder is a method using a difference in the wave length characteristic of reflecting power between the insulating film and metal circuit lines so as to inspect the workpiece shown in FIG. 11 and using the wave length characteristics of reflecting power of the circuit lines metal and protection metal so as to inspect the workpiece shown in FIG. 12.

In this case, for example, for the workpiece shown in FIG. 11, polyimide is used as an insulating film 70 and aluminum is used as circuit lines 20 (hereinafter, this combination is referred to as "sample 1"). For the workpiece shown in FIG. 12, copper is used as a circuit lines metal 25 which is equivalent to 20 shown in FIG. 11 and chromium is used as an upper protection metal 40 (hereinafter, this combination is referred to as "sample 2"). As to the other numerals shown in the drawing, 35 indicates a resist, 41 a lower protection metal film, 46 an etching remnant due to a resist residue fault, 47 an etching remnant, and 50 a columnar metal (VIA).

Next, the optical characteristic of each sample will be explained.

FIG. 13 shows measured results of the spectral reflectance of polyimide and aluminum of the sample 1. The horizontal axis represents a wave length and the vertical axis represents a reflectance. As to polyimide, there are aluminum circuit lines under polyimide in an actual substrate as shown in FIG. 11, so that in the samples used for measurement, polyimide is coated on aluminum.

FIG. 13 shows that to discriminate the aluminum pattern on polyimide of the sample 1, it is desirable to detect light with a wave length less than 450 nm at which the difference in reflectance between them is great.

FIG. 14 shows measured results of the spectral reflectance of copper and chromium of the sample 2. The horizontal axis represents a wave length and the vertical axis represents a reflectance.

FIG. 13 shows that to discriminate chromium on copper shown in FIG. 12, it is desirable to detect light with a wave length less than 450 nm or with a wave length more than 650 nm.

(II)'" Etching remnant inspection apparatus

Next, the etching remnant inspection apparatus will be explained with reference to FIG. 15 to FIG. 17. The units of the apparatus other than the detection optical system are the same as those shown in FIG. 6, so that the explanation thereof will be omitted and only the detection optical system will be explained hereunder.

(II-1)"

First, an example of the constitution of the etching remnant inspection apparatus relating to the present invention will be explained with reference to FIG. 15.

Figure 15:
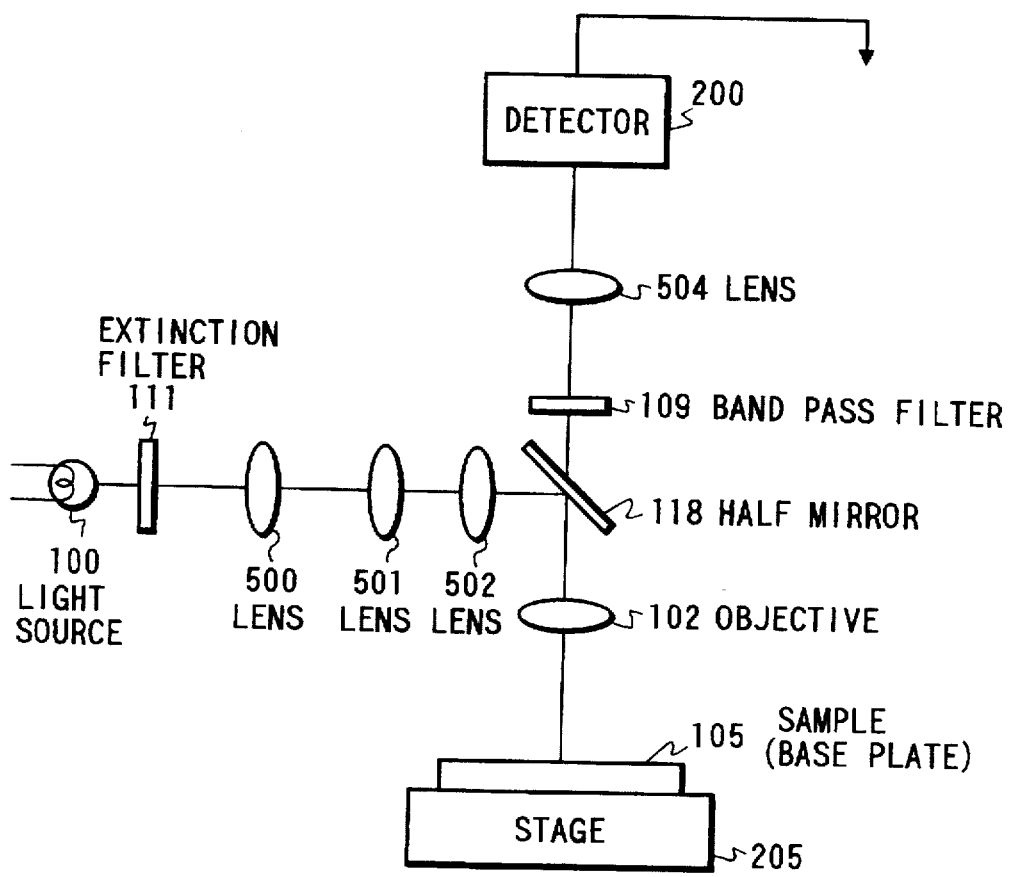
FIG. 15 is a schematic diagram for explaining the operation of an etching remnant inspection apparatus relating to the embodiments of the present invention.

FIG. 15 is a schematic diagram for explaining the operation of an etching remnant inspection apparatus relating to the embodiments of the present invention.

Light emitted from the light source 100 is irradiated (down lighting) to a sample 105 vertically from above via a half mirror 118 and an objective lens 102. By doing this, only light in the specific wave length range among the reflected light from the sample transmits through filter 109 and is focused on the sensor surface of the detector 200. For the reason described in (I), as a filter 109, a filter which transmits light with a wave length of less than 450 nm is used for the sample 1 and a filter which transmits light with a wave length of more than 650 nm is used for the sample 2.

As a light source 100, a mercury lamp, xenon lamp, or halogen lamp can be used. As a detector 200, a TV camera, a linear image sensor, or a TDI sensor mentioned above can be used.

In FIG. 15, numeral 111 indicates an extinction filter, 500 to 502 and 504 lenses, and 205 a stage.

By doing this, in the sample 1, aluminum is detected in a light state and polyimide is detected in a dark state. In the sample 2, copper is detected in a light state and chromium is detected in a dark state.

Therefore, by using the picture processing recognition apparatus 201 (omitted in the drawing), the area of each material is divided depending on light or dark and a part such that a part which is to be "light" originally is "dark" or a part which is to be "dark" originally is "light" can be taken out.

(II-2)"

Furthermore, another example of the constitution of the etching remnant inspection apparatus relating to the present invention will be explained with reference to FIG. 16.

Figure 16:
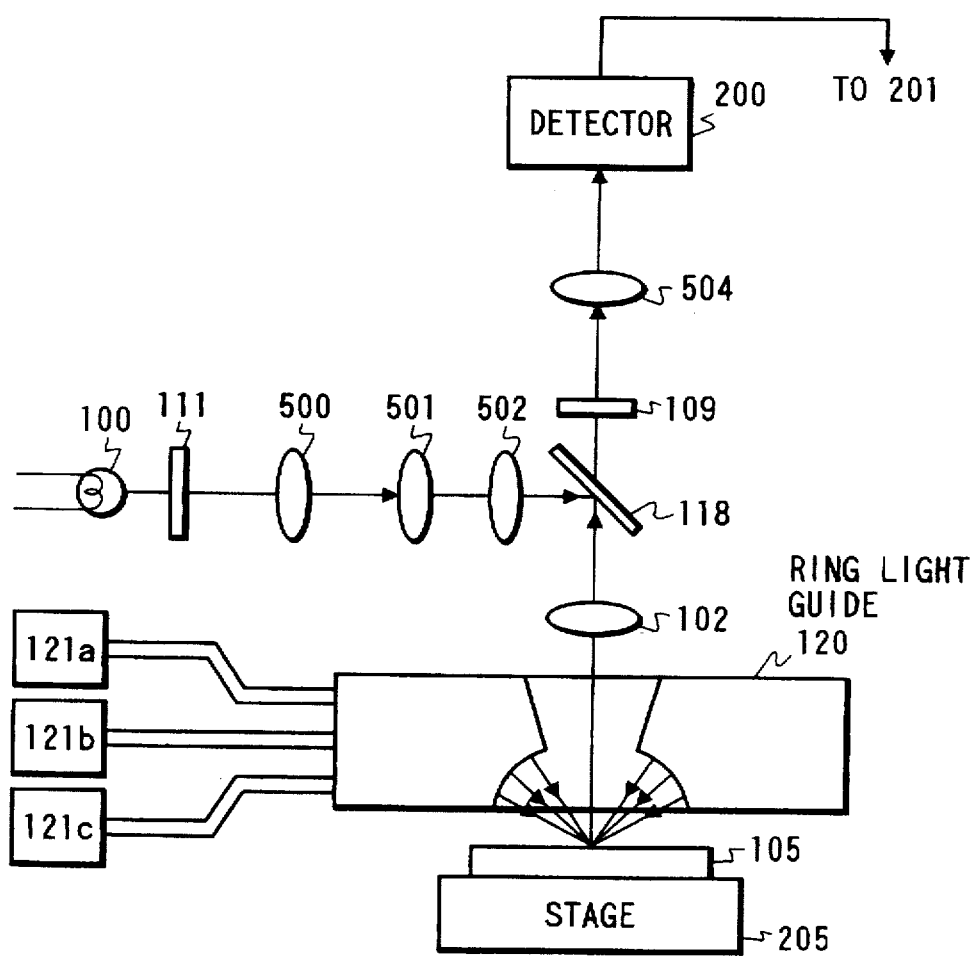
FIG. 16 is a schematic diagram for explaining the operation of another etching remnant inspection apparatus relating to the embodiments of the present invention.

FIG. 16 is a schematic diagram for explaining the operation of another etching remnant inspection apparatus relating to the embodiments of the present invention.

A ring light guide 120 is structured so that the sections of an optical fiber are arranged in stages (three stages in the drawing) and in a circle and guide a pattern so as to be lighted obliquely from the whole periphery of the objective lens 102. According to this constitution of the inspection apparatus, even when a pattern is inclined (for example, the circuit lines pattern shown in FIG. 11), it can be discriminated by additionally lighting it obliquely.

In this drawing, numerals 121a, 121b, and 121c indicate light sources for light guide.

(II-3)"

Finally, still another example of the constitution of the etching remnant inspection apparatus relating to the present invention will be explained with reference to FIG. 17.

Figure 17:
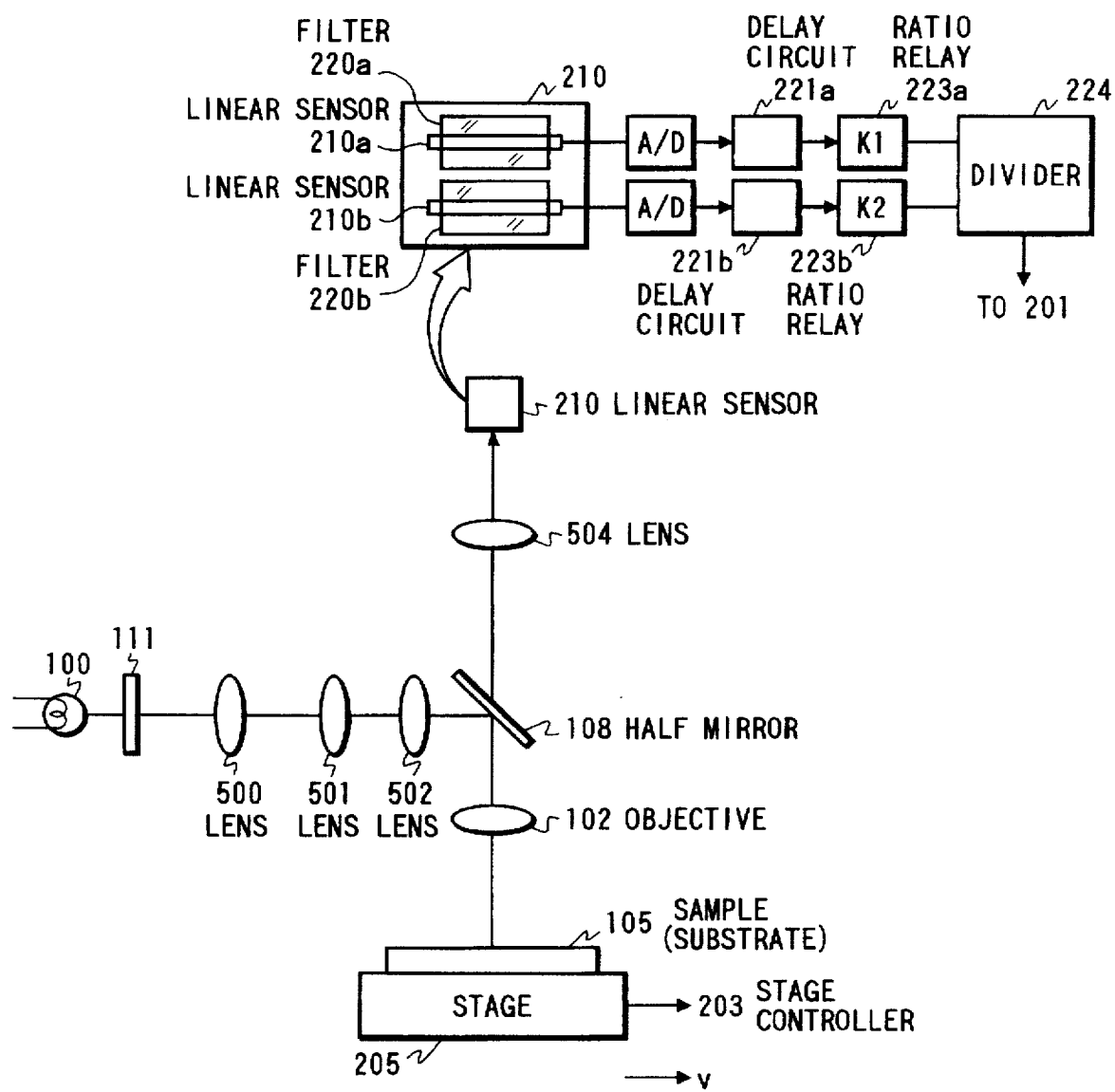
FIG. 17 is a schematic diagram for explaining the operation of still another etching remnant inspection apparatus relating to the embodiments of the present invention.

FIG. 17 is a schematic diagram for explaining the operation of still another etching remnant inspection apparatus relating to the embodiments of the present invention.

In this constitution of the inspection apparatus, a detector 210 in which two linear image sensors 210a and 210b are lined up closely in parallel (an example, such a sensor is the of "Dual Image Sensor") is used. Filters 220a and 220b are mounted to the linear image sensors 210a and 210b respectively.

The filters 220a and 220b are different in the transmission wave length range, and accordingly the two linear image sensors are different in the detection wave length range, and images are detected by moving the stage 205 continuously at a fixed speed.

Assuming that the moving speed of the stage 205 is v and the distance between the detection areas of the two linear image sensors 210a and 210b on the sample surface is d, a location on the sample which is detected by one linear image sensor is sensed by another linear image sensor which passes it d/v minutes before or after (before or after is switched depending on forward movement or backward movement of the stage).

The linear image sensors 210a and 210b convert the intensity of inputted light photoelectrically to a voltage. When it is converted from analog to digital and the timing of one output signal is delayed by d/v (or −d/v) by delay circuits 221a and 221b, the two output signals are nothing else but signals from the same location of the sample. Namely, the constitution of this inspection apparatus provides a function which is the same as that for detecting the reflected light from a sample by two wave lengths.

Finally, the output signals which pass the delay circuits 221a and 221b are multiplied by suitable coefficients k1 and k2 by ratio relays 223a and 223b and the quotient of the output value of one linear image sensor which is divided by another output value by a divider 224 is sent to the picture processing recognition apparatus 201.

When detection of the sample 2, that is, of chromium on copper is an object, a filter which transmits light with a wave length less than 450 nm is used as a filter 220a, and a filter which transmits light with a wave length more than 650 nm is used as a filter 220b, and the output value from the sensor 210a is divided by the output value from the sensor 210b by the divider. The spectral reflecting powers of copper and chromium are as shown in FIG. 14, so that when the output value of the sensor 210a is greatly different from the output of the sensor 210b, the part is copper. In this embodiment, the intensity varies with the wave length of the light source 100, and the sensitivity varies with the wave lengths of the linear sensors 210a and 210b, and the transmission factors of the filters 220a and 220b are different from each other. However, suitable values are set as the coefficients k1 and k2, and the aforementioned division is performed, and the part where the division result is great is decided as copper.

The inspection method described in (II-3)" has the following advantages.

Namely, the intensity of reflected light, that is, the brightness itself on an image is easily affected by the roughness and irregularity of surface. When the surface is rough and inclined though the reflecting power is high, the quantity of light detected may be decreased. Therefore, the embodiment shown in FIG. 15 is valid when the sample surface is flat and smooth. However, when the sample surface is not flat and smooth, the relative magnitude of brightness on a detected image, for example, that between copper and chromium (copper is light and chromium is dark) is not stable. On the other hand, in this method, it is not decided that a lighter part is copper but it is decided that a part having the spectral reflecting characteristic of copper is copper. Therefore, the decision is little affected by the roughness and irregularity of surface and the part of copper can be detected more stably.

Only the down lighting is used in FIG. 17. However, the lighting by ring light as shown in FIG. 16 may be used together. The two filters having different transmission wave length ranges may be installed in suitable positions on the lighting side and detection side when the positions are optical conjugation positions with the sensor surfaces without being mounted to the sensor surfaces. Furthermore, in place of the two linear image sensors which are lined up closely in parallel so as to be integrated, two normal linear sensors may be used or red, green, and blue outputs of a color television camera may be used.

DETAILED EXPLANATION OF THE ETCHING REMNANT REPAIR PROCESS (I)"' Etching remnant repair apparatus The etching remnant repair apparatus used in the process shown in FIG. 2 and the process 1/j shown in FIG. 3 may be an apparatus having the same constitution as that shown in FIG. 10 basically. However, the object in this case is to remove an etching remnant of metal, so that the fundamental wave and harmonic thereof of a carbon oxide laser, ruby laser, excimer laser, or YAG laser are used as a laser beam. When a laser beam is irradiated to a part, the part will be dissolved, evaporated, and lost.

What is claimed is:

1. A thin film producing method for forming a thin metal film circuit pattern on a substrate, comprising the steps of:

forming a thin metal film on the substrate;

coating a photoresist on said thin metal film which will be formed into the thin metal film circuit pattern;

exposing said photoresist to exposing light and developing said photoresist so as to form a resist pattern;

inspecting said resist pattern formed by said exposing and developing step and pointing out a location of a lacking-fault part of said resist pattern;

repairing only the lacking-fault part of said resist pattern on the basis of the information regarding the lacking-fault part location which is provided by said step of inspecting said resist pattern;

etching said thin metal film so as to form said thin metal film circuit pattern by using said resist pattern repaired in the repairing step as a mask, said etching step of the thin metal film being carried out after said inspecting and repairing steps of said resist pattern;

inspecting the thin metal film pattern which is formed at said etching step and pointing out a location of a residue-fault of part of said thin metal film pattern; and repairing only the residue-fault part of said thin metal film pattern on the basis of the information regarding residue-fault part location which is provided by the step of inspecting said thin metal film pattern.

2. A thin film producing method according to claim 1, wherein said resist pattern inspecting step is executed by irradiating excitation light, the wavelength and intensity of which are adjusted so that the photoresist is not exposed by said excitation light and said resist pattern inspecting step is executed by detecting the resist pattern as a fluorescent image at said resist pattern inspecting step.

3. A thin film producing method according to claim 1, wherein at said resist pattern inspecting step intensity and lighting time of said excitation light which is irradiated by lighting means are controlled so as not to exceed a predetermined value of said exciting light expressed by light intensity × lighting time to prevent said resist pattern from exposure.

4. A thin film producing method according to claim 1, wherein at the step of repairing the lacking-fault part of said resist pattern, photoresist is locally supplied to the lacking-fault part of said resist pattern, and the lacking-fault part is locally pattern-exposed by an exposure light to develop said locally supplied photoresist to photoresist at said lacking-fault part of said resist pattern.

5. A thin film producing method for forming a thin metal film circuit pattern on a substrate, comprising the steps of:

forming a thin metal film on the substrate;

forming a resist pattern on said thin metal film which will be formed into the thin film circuit pattern;

inspecting said resist pattern and pointing out a location of a fault part of said resist pattern;

repairing the fault part of said resist pattern on the basis of the information regarding the fault part location which is provided by said step of inspecting said resist pattern;

etching said thin metal film so as to form said thin metal film pattern by using said resist pattern repaired in the repairing step as a mask, said etching step of the thin metal film being carried out after said inspecting and repairing steps of said resist pattern;

inspecting the thin metal film pattern which is formed at said etching step and pointing out a location of a fault part of said thin metal film pattern; and repairing the fault part of said thin metal film pattern on the basis of the information regarding fault part location which is provided by the step of inspecting said thin metal film pattern.

6. A thin film producing method for forming a thin metal film circuit pattern on a substrate, comprising the steps of:

forming a thin metal film on the substrate;

coating a photoresist on said thin metal film which will be formed into the thin metal film circuit pattern;

exposing said photoresist to exposing light and developing said photoresist so as to form a resist pattern;

inspecting said resist pattern formed by said exposing and developing step and pointing out a location of a fault part of said resist pattern;

repairing the fault part of said resist pattern on the basis of the information regarding the fault part location which is provided by said step of inspecting said resist pattern;

etching said metal film so as to form said thin metal film pattern by using said resist pattern repaired in the repairing step as a mask, said etching step of the metal film being carried out after said inspecting and repairing steps of said resist pattern;

inspecting the thin metal film pattern which is formed at said etching step and pointing out a location of a fault part of said thin metal film pattern; and repairing the fault part of said thin metal film pattern on the basis of the information regarding fault part location which is provided by the step of inspecting said thin metal film pattern.

* * * * *

UNITED STATES PATENT AND TRADEMARK OFFICE
CERTIFICATE OF CORRECTION

PATENT NO. : 5,763,123

DATED : 9 June 1998

INVENTOR(S) : Chie SHISHIDO et al.

It is certified that error appears in the above-identified patent and that said Letters Patent is hereby corrected as shown below:

IN THE TITLE PAGE, [75] line 2: Change "Hoshishiba" to --Koshishiba--.

| Column | Line | |
|---|---|---|
| 2 | 20 | Before "substrate" (first occurrence) delete "entire"; before "substrate" (second occurrence) insert --entire-- |
| 2 | 53 | After "fault" change "that" to --whereby--. |
| 2 | 56 | After "fault" change "that" to --whereby--. |
| 4 | 18 | Before "present" insert --the--. |
| 5 | 18 | Change "a1" to --a1--. |
| 7 | 36 | Change "a1" to --a1--. |
| 7 | 56 | After "exposed" insert --by--. |
| 8 | 16 | Before "output" (first occurrence) delete "first"; before "output" (second occurrence) insert --first--. |

UNITED STATES PATENT AND TRADEMARK OFFICE
CERTIFICATE OF CORRECTION

PATENT NO. : 5,763,123
DATED : 9 June 1998
INVENTOR(S) : Chie SHISHIDO et al.

It is certified that error appears in the above-identified patent and that said Letters Patent is hereby corrected as shown below:

| Column | Line | |
|---|---|---|
| 9 | 41 | After "film" insert --,--. |
| 9 | 66 | Change "closely" to --strongly--; after "film" delete "strongly". |
| 10 | 8 | After "difference" insert --between--. |
| 10 | 10 | Change "that they" to --those that--. |
| 10 | 59 | Change "reason of" to --reason for--. |
| 10 | 66 | Change "Hoachst" to --Hoechst--. |
| 11 | 6 | After "inspection" insert --(step f)--. |
| 12 | 41 | Change "Hoachst" to --Hoechst--. |
| 12 | 44 | Change "on sale" to --, which is commercially available,--. |

UNITED STATES PATENT AND TRADEMARK OFFICE
CERTIFICATE OF CORRECTION

PATENT NO. : 5,763,123
DATED : 9 June 1998
INVENTOR(S) : Chie SHISHIDO et al.

It is certified that error appears in the above-identified patent and that said Letters Patent is hereby corrected as shown below:

| Column | Line | |
|--------|------|---|
| 14 | 26 | Change "96 linear sensors" to --linear sensors 96--. |
| 15 | 49 | Change "Firstly" to --First--. |
| 16 | 5 | Change "examiner" to --eximer--. |
| 17 | 32 | Change "sample 1" to --sample 1--. |
| 17 | 49 | Change "such that" to --such as--. |
| 18 | 13 | Change "example," to --example of--. |
| 18 | 14 | Delete "of". |
| 18 | 17 | Before "transmission" delete "the". |

Signed and Sealed this

Twenty-third Day of February, 1999

Attest:

*Attesting Officer*

Q. TODD DICKINSON

*Acting Commissioner of Patents and Trademarks*